United States Patent [19]

Lindmayer

[11] 4,137,095

[45] Jan. 30, 1979

[54] CONSTANT VOLTAGE SOLAR CELL AND METHOD OF MAKING SAME

[75] Inventor: Joseph Lindmayer, Bethesda, Md.

[73] Assignee: Solarex Corporation, Rockville, Md.

[21] Appl. No.: 795,012

[22] Filed: May 9, 1977

Related U.S. Application Data

[60] Continuation-in-part of Ser. No. 705,063, Jul. 14, 1976, Pat. No. 4,056,879, which is a division of Ser. No. 614,619, Sep. 18, 1975, Pat. No. 3,990,097.

[51] Int. Cl.$^2$ ......................................... H01L 21/225
[52] U.S. Cl. .................................. 136/89 SG; 29/572; 148/33.5; 148/187; 148/188; 357/30
[58] Field of Search ...................... 148/33.5, 188, 187, 148/178; 136/89 SJ, 89 SG, 89 CC; 29/572; 357/30, 63

[56] References Cited

U.S. PATENT DOCUMENTS

| 3,811,954 | 5/1974 | Lindmayer | 29/572 X |
| 3,888,698 | 6/1975 | Lindmayer et al. | 136/89 CC |
| 3,895,975 | 7/1975 | Lindmayer | 148/178 |
| 3,943,016 | 3/1976 | Marcotte | 148/190 X |
| 3,990,097 | 11/1976 | Lindmayer | 357/30 |
| 4,028,720 | 6/1977 | Pankove | 357/30 |
| 4,056,879 | 11/1977 | Lindmayer | 29/572 |

Primary Examiner—G. Ozaki
Attorney, Agent, or Firm—Watson, Cole, Grindle & Watson

[57] ABSTRACT

A silicon solar energy cell producing electricity at substantially constant voltage despite significant increases in illumination, in which the back surface junction of the cell is formed by alloying with gallium.

10 Claims, 1 Drawing Figure

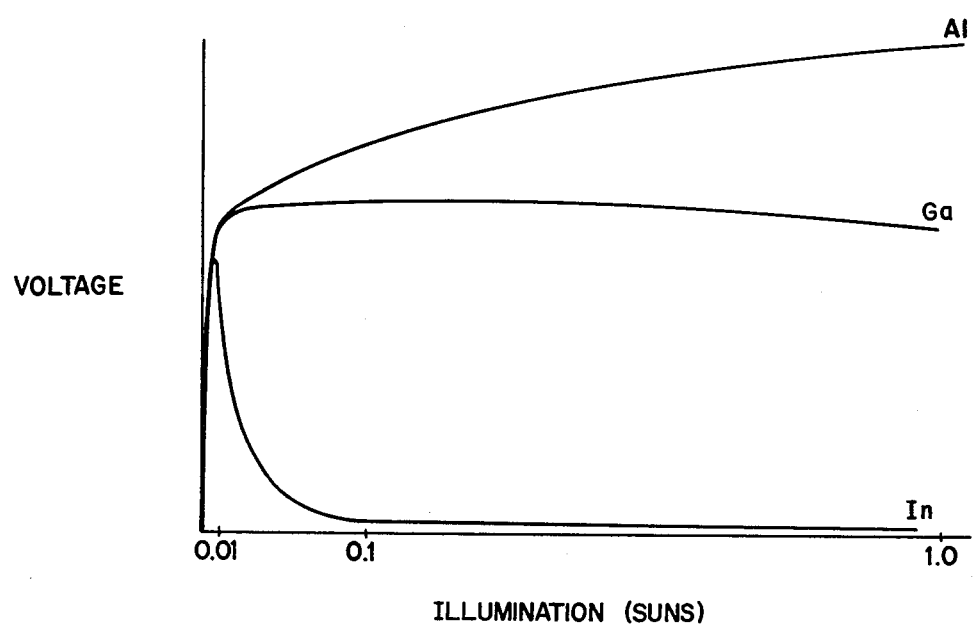

CONSTANT VOLTAGE SOLAR CELL AND METHOD OF MAKING SAME

This application is a continuation-in-part of my copending application Ser. No. 705,063, filed July 14, 1976, now U.S. Pat. No. 4,056,879, which was a division of Ser. No. 614,619 filed Sept. 18, 1975 now U.S. Pat. No. 3,990,097, issued Nov. 2, 1976 on an application filed Sept. 18, 1975.

In the manufacture of silicon solar energy cells, an impurity is diffused into a wafer of silicon that has previously been doped with an impurity of opposite polarity. Thus, for n-p type silicon solar cells, the diffusion process usually employs compositions of phosphorus or arsenic where the silicon wafer that is the precursor of the cell has been doped with, e.g., boron. After an electrical junction has been established in the wafer, contacts are applied to the front surface of the cell, which is adapted to absorb light impinging thereon and thereby generate an electrical current, and to the back, non-exposed surface of the wafer. Since diffusion normally takes place before contacts are applied, it is necessary either to protect the back surface of the silicon wafer during diffusion or later to eradicate the undesirable junction that has been formed at the back surface.

An important solution to the problem of making unnecessary the protection of the back surface of the silicon wafer during diffusion is disclosed in my U.S. Pat. No. 3,990,097, issued Nov. 2, 1976. A divisional application having the same disclosure as said patent is presently pending and has issued as U.S. Pat. No. 4,056,879. In such patent and application, a method and product are disclosed whereby the back surface of the wafer is not protected during diffusion, but metallic aluminum is applied over the layer of diffusant glass formed on the back surface after diffusion. This coating of aluminum is then alloyed through the glass and reverses the polarity of the diffusant junction formed inwardly of the back surface of the wafer. Further, the aluminum coating may be used as the back contact for the cell, itself, and an aluminum back contact has been found most useful in silicon solar energy cells.

A specific application has now arisen with respect to a particular metallic coating alloyed into the back surface of a silicon wafer but applied to a layer of diffusant glass on such back surface in accordance with the method and product of my previous patent and application. The specific utilization of solar cells to which the present invention is most applicable is that in which a constant cell voltage is desired. One such use, for example, is to recharge batteries. In many of the applications to which solar cells have been put, an important utilization is to continuously apply a "trickle charge" to a battery that powers a device located far from more conventional sources of electricity. Thus, solar panels using a multiplicity of cells have found employment on sea-going oil and gas drilling rigs, and for recharging battery-powered microwave relay stations located at the peaks of mountains.

Whether the battery being recharged is small or large, the possibility of overcharging the battery can present a serious hazard. While it is possible to use a voltage regulator to prevent overcharging, such a regulator increases expenses, may reduce efficiency of the overall system, and is simply another piece of equipment subject to corrosion and ultimately, to failure. Without the voltage regulator, the battery can be overcharged to the point of failure, indeed even to explosion. In any case, failure of the battery leads to inoperativeness of the load devices, e.g., the light on a buoy, or the operation of a solar powered watch or flashlight or pocket calculator.

In terrestrial uses of solar cells, therefore, it will be apparent that it is often desirable for a solar cell to maintain a substantially uniform voltage output, since there will be wide variations in illumination present under ambient conditions. In outdoor conditions, cloud coverage and reflective surfaces present will cause illumination to vary by hundreds of folds. Indoors, there will be similar variations from low light levels up to the multiple suns provided by a floodlight.

It is, consequently, a primary object of the present invention to provide a solar energy cell in which, once the desired voltage has been reached, exposure to significantly increased illumination will not significantly increase the voltage generated by the cell to a level such that a device or battery powered by the cell will become inoperative. This object is accomplished not by a regulator circuit, but through the inherent electrical characteristics of the cell, which are thereby preserved even at low light levels.

While there are other methods of forming a silicon solar energy cell having a substantially constant voltage output under varying conditions of illumination, and while I, myself, have devised such methods and cells, the present invention to which this application is directed is the use of gallium as an alloying agent to form a back junction in the cell. In the past gallium has been disclosed as an alternative to aluminum for some uses. However, it has not, to the best of my knowledge, found any success in its use when applied to a film of diffusant glass overlying the surface of a silicon wafer. For example, in my U.S. Pat. No. 4,056,879 I concluded that gallium was not a useful substitute for aluminum in the process and product disclosed and claimed in that application and its parent application. I have now discovered that although gallium is not a general substitute for aluminum in that product and process when used to form a back junction, it does produce a cell that has a different function and use not possessed by some aluminum-alloyed cells: it results in a solar cell having a substantially constant voltage output.

In its most basic method form, my invention comprises taking a wafer of material such as silicon and forming an electrical junction inwardly of a major surface of the wafer. Gallium is applied to that surface as a coating, and the wafer is heated at such temperature and for such time as will enable the gallium to penetrate the glass film and then the major surface, itself, and to reach the junction inwardly of the surface. When this occurs, the gallium will overcome the polarity of the junction and form a gallium junction in its place.

Typically, a wafer of silicon will have two so-denominated major surfaces, i.e., a back surface and a front surface. Thus, in my U.S. Pat. No. 4,056,879 I have described and illustrated a wafer in the form of a circular disc about 3 inches in diameter, which wafer has a front surface and a back surface. When an impurity is diffused into the wafer, glasses including the diffusant/impurity will be formed on both the front and back surfaces of the wafer and electrical junctions will be formed inwardly and closely adjacent to said front and back surfaces. When it is desired to overcome the polarity of the back surface junction so formed, gallium is applied to the diffusant glass film that overlies the back surface of the wafer. After the application of heat, the gallium will have penetrated the back surface film and the back surface, and will have overcome the polarity of the back surface junction to form a gallium junction thereat.

In most typical uses of solar cells, I have used phosphorus as a most preferred diffusant/impurity, although arsenic and similar impurities may also be used, and have initially doped the silicon wafer with boron, although aluminum and similar dopants may also be useful. In such instance, an n-p solar cell will be formed, in which the junction formed at the front surface will be a phosphorus-boron junction, and the gallium junction formed at the back surface will be a gallium-boron junction, such junctions being of opposite polarity. As so formed, the cell may be described as an n-p-p plus cell.

As stated, it is an important feature of the present invention that gallium be alloyed into a major surface of the wafer, preferably the back surface thereof. It has been determined that, unexpectedly, such a gallium junction results in a solar cell that maintains a substantially constant voltage under significant increases in illumination. Such phenomenon will be more readily apparent by reference to the accompanying drawing, which forms a part hereof, and in which FIGURE, the sole FIGURE, is a graph plotting voltage as the ordinate against illumination as the abscissa for solar cells having a back junction formed from any of the three different metals. Each cell was produced by the same method, i.e., by diffusing junctions into a silicon wafer and forming glass films on the major surfaces thereof, coating the back surface with the metal, then heating the wafer to form a metal-dopant junction inwardly of the back surface. In each case, voltage output in terms of millivolts was plotted against illumination in terms of suns, a sun being the maximum theoretical amount of light that impinges on an object at the equator fully exposed on a cloudless day at noon standard time at an equinox.

The graph of the FIGURE, illustrates the difference obtained when the back junction of a cell is formed from a metal-dopant in which the metal is aluminum, gallium, or indium. While in the past these three metals may have been thought to have been interchangeable in forming back junctions, it will be clear from the graph that when they are used according to the present methods, i.e., a method in which the metal is diffused into the back or other major surface of a wafer through a glass film on the surface, the result in voltage output varies considerably according to which metal has been used. Thus, generally, the aluminum back junction cell has voltage that continues to rise under increased illumination from about 0.01 suns to 1 sun and beyond. After illumination of 0.01 suns has been reached, the gallium back junction cell has a voltage output that remains substantially constant, although by the use of this term I do not mean to imply that the voltage output will remain absolutely constant. For reasons not fully understood, the voltage of the indium back junction cell declined sharply after an illumination of 0.01 suns had been reached and remained at a very low level, particularly after 0.1 suns illumination. Where maximum voltage is desired, aluminum will be the preferred metal to be used in forming the back junction. However, where a constant voltage is desired, a simple manner of achieving that voltage may be accomplished according to my invention herein described, i.e., by employing gallium as the metal used to form the back junction.

To describe certain features of my method with greater particularity, metallic gallium may be coated onto a major surface glass film by any known method, e.g., by evaporating, brushing or the like, although I have found that evaporation techniques are preferable because the thickness of the coating may be more accurately controlled. After the gallium coating has been applied, heating is carried out at such time and temperature as will enable the gallium to penetrate the film and the major surface in a reasonable amount of time. Thus, the broad range of temperatures that have been found practical is 700° to 900° C. Below that temperature range, it is difficult to obtain proper penetration by the gallium; above that range penetration is effected, but where there is a front junction already formed in the wafer, higher temperatures will begin to affect the front junction. Within that broad temperature range, a subrange of 800° to 850° C is preferred, with an optimum temperature of about 850° C having been determined.

In a preferred embodiment of my invention, I have proceeded in general accord with the preferred embodiment set forth in my U.S. Pat. No. 4,056,879, that is, I take a circular disc of silicon, which may be three inches in diameter and about ten mils in thickness, and subject it to diffusion by an impurity. If I desire to form an n-p-p plus cell, I have previously doped the silicon in wafer form with boron, in which case diffusion is carried out in an atmosphere of phosphine, oxygen and argon in an oven at a temperature of about 840° C for 20 minutes. In particular, I used 1% phosphine in argon at an input rate of 1200 cc/min., oxygen at 70 cc/min. and argon at 650 cc/min. A uniform exhaust from the furnace was maintained. After diffusion has been completed, phosphorus-boron junctions had been formed inwardly of the front and back surfaces of the disc, and each surface was covered with a film of phosphor glass.

A coating of metallic gallium was now applied to the glass film on the back surface of the wafer by means of evaporation. The coating was about 5000Å thick. Then the wafer was heated in an oven at 850° C for about 8 minutes, in which time the gallium had penetrated the glass film and the back surface of the wafer and formed a gallium-boron back junction, overcoming and negating the phosphorus-boron junction previously formed at the back surface. By such heating, the front junction, which is a phosphorus-boron junction, remained intact. Consequently, there were now two junctions formed in the cell: a front n-p junction and a back p-p+junction. The back junction had an overlying coating or film composed of gallium, diffusant/impurity (here phosphorus) and oxygen, which coating has been referred to herein as a diffusant glass. The impurity that is to be impregnated into the wafer has sometimes been referred to herein as a diffusant or diffusant/impurity, while the impurity with which the silicon had been impregnated prior to being subjected to diffusion has sometimes been referred to herein as a dopant.

It will be understood that I have hereinbefore referred to a specific embodiment of my invention for the purpose of illustration only, and that obvious alterations and modifications and use of equivalent materials will be apparent to those of skill in this art. Thus, elements other than boron, e.g., aluminum, can be used as dopants. As to all such obvious alterations and modifications, it is desired that they be included within the purview of my invention, which is to be limited only by the scope, including equivalents, of the following, appended claims.

I claim:

1. A method of forming a silicon solar energy cell capable of maintaining a substantially constant voltage during exposure to significant increases in illumination, comprising heating a silicon wafer having at least one major surface with a diffusant/impurity to form an electrical junction inwardly of said major surface and a film of diffusant glass on said surface, applying a coating of gallium to the glass film, and then heating the wafer at a temperature and for a time sufficient to enable the gallium to penetrate the glass film, negate the polarity of the junction and form a gallium junction in its stead.

2. A method as claimed in claim 1, in which the gallium-coated wafer is heated at a temperature of about 700° to 900° C.

3. A method as claimed in claim 2, in which the gallium-coated wafer is heated at a temperature of about 800° to 850° C.

4. A method as claimed in claim 3, in which the gallium-coated wafer is heated at a temperature of about 850° C.

5. A substantially constant voltage silicon solar energy cell produced by the practice of the method of claim 1.

6. A method of forming a silicon solar energy cell capable of maintaining a substantially constant voltage during exposure to significant increases in illumination, comprising heating a silicon wafer having front and back major surfaces with a diffusant/impurity to form electrical junctions of the same polarity inwardly of said front and back surfaces and films of diffusant glass on said front and back surfaces, applying a coating of gallium to said back surface film, and then heating the wafer at a temperature and for a time sufficient to enable the gallium to penetrate the back surface film, negate the polarity of the back junction and form a gallium back junction in its stead, said back junction having a polarity opposite to that of said front junction.

7. A method as claimed in claim 6, in which heating of the gallium-coated wafer is carried out at a temperature not substantially exceeding 900° C.

8. A method as claimed in claim 6, in which said diffusant/impurity is selected from the group consisting of phosphorus and arsenic.

9. A method as claimed in claim 8, in which prior to diffusion, the wafer has been doped with an impurity selected from the group consisting of boron and aluminum.

10. A method as claimed in claim 6, in which the diffusant is phosphorus, prior to diffusion the wafer has been doped with boron, and in which heating of the gallium-coated wafer is carried out at a temperature of about 850° C.

* * * * *